United States Patent
Lecce et al.

[11] Patent Number: 5,917,254
[45] Date of Patent: Jun. 29, 1999

[54] CIRCUIT FOR THE CONTROLLED RECYCLE WITHOUT OSCILLATION OF A DISCHARGE CURRENT FROM AN INDUCTIVE LOAD

[75] Inventors: Sergio Lecce, Pavia; Massimo Grasso, San Martino Siccomario; Giorgio Rossi, Nerviano, all of Italy

[73] Assignee: SGS-Thomson Microelectronics, S.r.l., Italy

[21] Appl. No.: 08/840,328

[22] Filed: Apr. 28, 1997

[30] Foreign Application Priority Data

Apr. 30, 1996 [EP] European Pat. Off. .............. 96830248

[51] Int. Cl.$^6$ ...................................................... H01H 47/00
[52] U.S. Cl. .......................... 307/125; 307/112; 307/130; 307/131; 327/110
[58] Field of Search ..................................... 307/112, 116, 307/125, 130, 131; 327/110, 314, 325, 424

[56] References Cited

U.S. PATENT DOCUMENTS 5,111,353  5/1992  Kotowski et al. ........................ 361/91

FOREIGN PATENT DOCUMENTS

0 321 663 A3  6/1989  Germany .
0 425 024 A3  5/1991  Germany .

*Primary Examiner*—Jeffrey Gaffin
*Assistant Examiner*—Jonathan Kaplan
*Attorney, Agent, or Firm*—Jenkens & Gilcrist, P.C.

[57] ABSTRACT

A circuit for the controlled recycle without oscillation of a discharge current from an inductive load. The circuit comprises an active element connected, in series with the inductive load, between first and second power supply terminals, and having a control terminal to which a driver circuit is connected. The circuit further includes a recycling regulating circuitry connected to a connection node between the active element and the inductive load, and sensitive to a voltage threshold at the connection node to generate, depending on attainment of that threshold, a power-on signal for application to the control terminal effective to start up recycling of the discharge current through the active element. The circuit further comprises a control circuit for controlling the voltage oscillation at the connection node at the end of the recycling. The control circuit includes a circuit having a relatively low resistive impedance and being selectively connectable, at least upon the active element being turned off at the end of the recycling, between the connection node and a node having a substantially zero impedance toward at least one of the first and second power supply terminals.

15 Claims, 4 Drawing Sheets

CIRCUIT FOR THE CONTROLLED RECYCLE WITHOUT OSCILLATION OF A DISCHARGE CURRENT FROM AN INDUCTIVE LOAD

FIELD OF THE INVENTION

The present invention relates to a circuit for controlled recycle without oscillation of the discharge current from an inductive load.

BACKGROUND OF THE INVENTION

Throughout the following background description, the field of electronic systems for automotive, in particular motor car, applications will be considered by way of non-limiting example. Thus, it will be appreciated that other applications may exist.

As is well known, a number of electronic and electromagnetic devices installed on motor cars have at least one inductive load. Such devices include, for example, relays of various types, motor driver devices, and fuel injection control devices. References will be made hereinafter to fuel injection control devices, by way of example.

Electronic fuel injection devices operate on the principle of opening the fuel path through an electronically controlled valve. The valve movement is controlled by means of a magnetic field generated by an electromagnet, which can be illustrated schematically by an inductor wound around a core and having a drive current flowing therethrough. By regulating the current flowing through the inductor, the injector can be controlled to open and close. This sets the amount of fuel being injected. In such devices, the inductive load has a terminal maintained at a fixed voltage and another terminal connected to a preferably integrated, control circuit operative to drive the flow of current through the load.

There exist two arrangements, wherein the fixed voltage terminal of the load is respectively connected to the power supply line and connected to ground. In the former arrangement, the load is driven through its low voltage terminal, in a so-called low-side configuration commonly employed in injection devices, whereas in the latter, a so-called high-side driver configuration is used. The control circuit includes an active element, which may be a drive transistor, usually a power one, acting as a switch to alternately force the current flow through the inductor and cut it off. The active element is controlled by a drive signal generated within the circuit.

As is known, the driving of highly reactive loads, as inductive loads are, generally causes some problems during the transients. When the flow of current through an inductor is cut off, the voltage across the inductor rises instantaneously, i.e. an overvoltage is created which may be positive or negative depending on the particular circuit configuration. This overvoltage is due to the energy, previously stored into the inductor during the charging phase and originated by the forced flow of electric current through the inductor, staying constant even after the current flow is cut off. Thus, an induced electromotive force is generated which tends to keep the current at the value it attained during he power-up period, i.e. during the charging phase. Since the load has one terminal held at a fixed electric potential, the increase of potential will take place on the other terminal, that is the connection terminal to the control circuit.

For the device to operate properly, the amplitude of the voltage peak must be a limited one. Otherwise, the peak could cause the junctions in the control circuit semiconductor elements, or in any other devices linked to the control circuit, to break down. Where the circuit is a monolithically integrated one, the overvoltage may also trigger on parasitic transistors and possibly cause the device to break down. As those skilled in the art know well, the measures to be taken in order to reduce this overvoltage include the provision of some means effective to dissipate the energy stored within the inductor, that is, effective to make a discharge current from the inductor to recycle. The energy stored in the inductive load is dissipated by having current passed out through pre-arranged elements, usually power elements.

In prior approaches, the recycling circuit also functions to regulate the voltage rise. As the current is being recycled, the voltage at the inductive load reaches indeed a maximum which is preset by the recycling means itself. This voltage limiting effect is known as "clamping" in technical literature. The voltage value clamped at the above-mentioned maximum remains constant for some time, to then decrease in absolute value, simultaneously with the current, down to a zero value which corresponds to a fully discharged inductive load. The duration of the discharge phase, i.e. the so-called discharge time, is dependent on the highest voltage value attained on the inductor.

The discharge time is of special importance, and should be accurately controlled. For example, with car-mounted devices, it is on the basis of this time that logic control circuits operatively connected to them are correspondingly calibrated. Furthermore, it is highly important for a fuel injector that the control current flowing through the load can be cut off within the shortest possible time, so that the injector closing time can be made short, such as to meter out accurately the amount of fuel, and minimize the waste of fuel upon the injector closing.

The discharge phase regulation is obtained by suitably dimensioning the recycling circuit such that the maximum voltage value can be selected to correspondingly suit. A well known class of circuit designs, to which the present invention is more specifically related, provide for recycling of the current through the very transistor which drives the inductive load and is inherently capable of withstanding the passage of the discharge current peak, it being usually a power element. A recycling regulating and driving circuit is connected between the load terminal intended for connection to the control circuit, i.e. to the drive transistor, and a control terminal of the transistor. This circuit controls the voltage value at the load and automatically turns on the transistor upon that voltage reaching a predetermined maximum. For an injector, the maximum voltage value is usually on the order of tens of volts, a typical value being 70 volts, for instance. A first prior circuit design provides for connection of generally one or more chains of n zener diodes between the control terminal of the drive transistor and the inductive load. The zeners are arranged to set the maximum voltage at the connection node to the load at a value $V_{max}$ equal to $nV_z$, $V_z$ being the zener voltages, less the voltage drop between the control terminal and the connection node, e.g., a VGS for a MOS type of drive transistor.

An improvement on the above prior approach additionally includes one or more bipolar transistors in the recycling circuit. In this case, the maximum voltage is determined by the combination of the zener voltages and the voltage drop base-emitter of the additional transistors and, accordingly, is preset as a combination of a larger number of voltage drops than in the previously described circuit. Where good temperature compensation is required for each selected value of maximum voltage, still more sophisticated precision designs are used which have good stability. For example, one prior circuit design uses a recycling regulating circuit which includes a voltage divider and a comparator. A circuit of that type is described, for example, in European Patent Application EP-0622717 by this Applicant.

To better appreciate the objectives of the present invention, it should be considered that—in general and regardless of the recycling regulating circuit being used—the output voltage, i.e., the voltage at the connection node to the inductive load, would not attain, at once and monotonically, the zero value that corresponds to full discharge, at the end of the recycling. A time period elapses from the moment when the drive transistor starts to power down to the moment when it is fully of. During this period, the voltage, and more generally the output electrical quantities, follow an oscillating trend.

It should be observed in this respect that a parallel circuit of the LRC type—L, R and C being overall values of inductance, resistance and capacitance, respectively—operates as a damped harmonic oscillator. This effect is due essentially to the reactive characteristics of the inductor and to conservation of energy, with consequent periodical transfer thereof between the inductance and the capacitance. When no more electromotive force is applied, i.e., during the circuit power-down phase, a more or less marked oscillation is established which depends on the circuit parameters. Of particular significance is a so-called factor of merit, Q, which is the ratio of the total stored energy to the energy dissipated during one oscillation period. For such circuits, it is $Q=(_oRC=R/(_oL)$, where $(_o=1/$ is a circuit constant having the dimensions of an angular frequency. Therefore, Q=R also is constant. The lower the Q-factor, the greater the oscillation damping.

In the instance of a recycling regulating circuit for an inductive load, the oscillating trend at the end of the recycling is due to the concurrent presence, on the connection node to the load, of an inductive load having its own inductance value, and an equivalent output capacitance which is due primarily to parasitic capacitances as seen from that connection node. For example, for a MOS drive transistor, the equivalent capacitance is substantially equal to the drain capacitance $C_D$, whose value is high compared to the other parasitic capacitances. The inductance and capacitance, along with the equivalent resistance due essentially to the drive transistor being powered down, form a parallel circuit of the LRC type. The oscillation is sustained with a factor of merit, Q', which is predetermined by the circuit parameters selected for a particular application.

Figure 1:
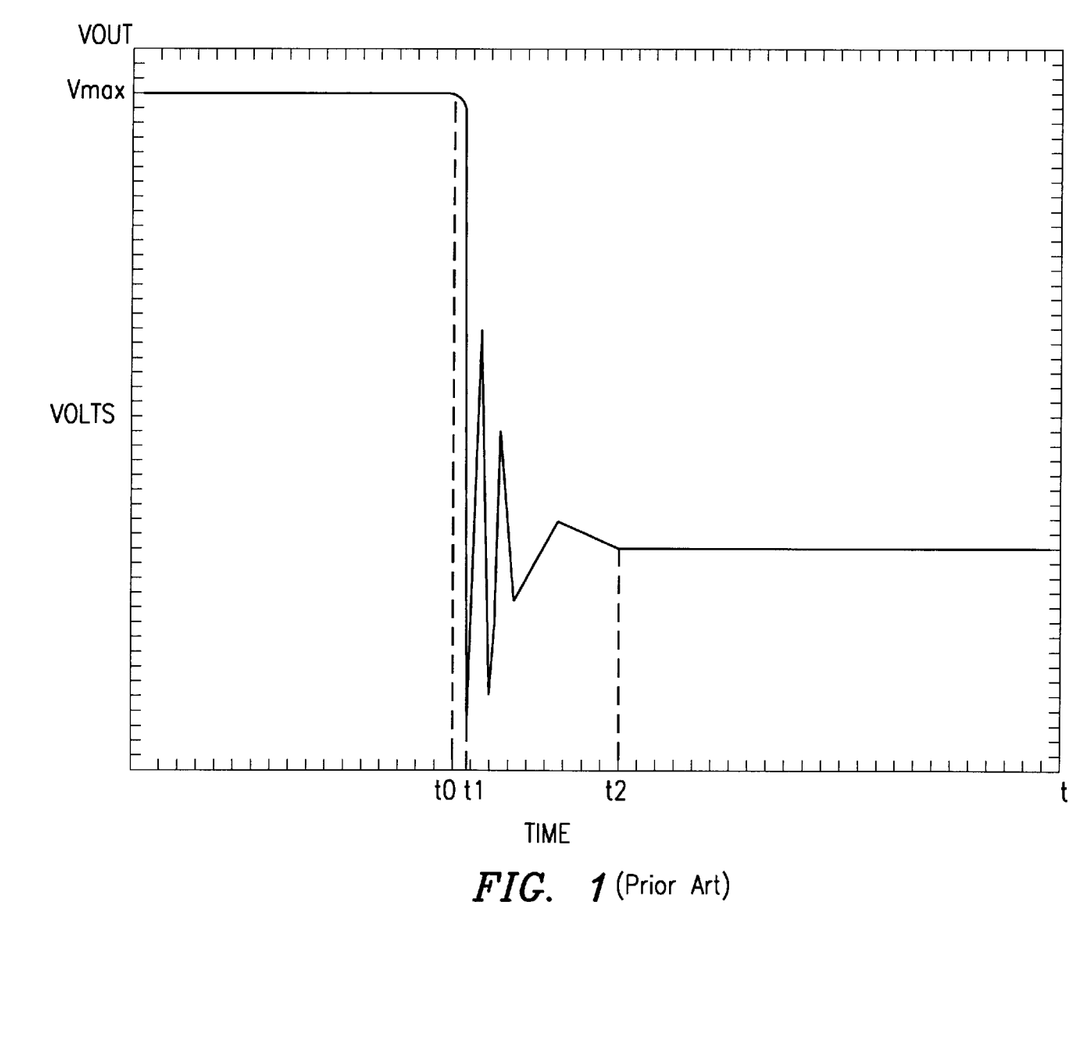
FIG. 1 is a schematic plot of the voltage at the connection node to the inductive load, relating to a prior art recycling circuit as previously described.

Shown in FIG. 1 is a simulation of the output voltage for a conventional control circuit for recycling the discharge current. The output voltage Vout is plotted vs. time. The circuit behavior is illustrated starting off with the recycling phase, wherein the output voltage is constant and has a predetermined value $V_{max}$ (clamping voltage), because of the clamping effect described previously. At a time t0, the voltage starts to drop at a fairly fast rate, depending in any case on both the clamping value $V_{max}$ and the magnitude of the inductive load, which, as known, can be schematically represented by an inductor L in series with a resistor R, and depending in particular on the time constant LR. The drive transistor starts to power down at a time t1 whereat the output voltage and correspondingly the current being recycled through the drive transistor reach a sufficiently low value. Due to the aforementioned effect, the voltage $V_{out}$ rises again from the time t1 to produce the oscillating trend. As shown in FIG. 1, it is only at a time t2 that the voltage attains a stationary value and therefore the oscillating phase is terminated, whose duration and magnitude are dependent on the circuit parameters, and in particular on the Q'-factor.

Due to this oscillation, the time to full discharge is further extended, which time should be kept as short as possible, as previously explained. Also, the interval between t1 and t2 represents a critical range for good circuit operation and is often a cause of undesired and uncontrollable behavior.

It should be first considered that in control devices for fuel injectors, the connection node to the inductive load usually represents a so-called alarm terminal or pin, i.e. protection circuits particularly for the drive transistor, are connected to it. Such circuits generate alarm signals, indicating a malfunction in the circuit and which are based on the voltage value at the node. Since this voltage value extends outside the safe range due to the oscillation shown, erroneous alarm signals may be generated accidentally, such as open-loop or open circuit signals, or vice-versa short-circuit signals. As a result, the device operation may be shut down.

In addition, an analysis of the behavior of the inductive load has shown that the new flow of current through the load during the oscillating phase can cause the injector valve to slightly open unexpectedly, causing a waste of fuel. Thus, what is needed is a simple recycling circuit which can drive an inductive load to the off state while suppressing the previously described oscillation during the final phases of the recycling.

What is also needed is such a circuit adaptable to conventional recycling circuits, such as circuits including zener diodes.

SUMMARY OF THE INVENTION

Accordingly, the present invention provides a circuit for the controlled recycle without oscillation of the discharge current from an inductive load comprising an active element and a recycling regulating means. The active element is connected in series with the inductive load between first and second power supply terminals, and has a control terminal to which a driver circuit is connected. The recycling regulating means is connected to a connection node between the active element and the inductive load. The recycling regulating means is sensitive to a voltage threshold at the connection node to generate, depending on attainment of this threshold, a power-on signal for application to the control terminal, and to start up the recycling of the discharge current through the active element.

The circuit for recycling further comprises a control circuit for controlling the voltage oscillation at the connection node at the end of the recycling. The control circuit includes a circuit means having a relatively low resistive impedance. This circuit means can be connected selectively, at least upon the active element being turned off at the end of the recycling, between the connection node and a node having a substantially zero impedance toward at least one of the first and second power supply terminals.

The present invention provides a method for the controlled recycle without oscillation of a discharge current from an inductive load through an active element connected in series with the inductive load between first and second power supply terminals and having a control terminal to which a driver circuit is connected to control it to the off and on states. Upon the active element being turned off, a step is provided of generating, depending on attainment of a voltage threshold at a connection node between the active element and the inductive load, a power-on signal for application to the control terminal of the active element and start-up recycling of the discharge current through the active element. The method further comprises the steps of providing a circuit means having relatively low resistive impedance and selectively connecting the circuit means between the connection node and a node having substantially zero impedance toward at least one of the first and second power supply terminals at least upon the active element being turned off at the end of the recycling.

The features and advantages of the recycling circuit according to the invention will be apparent from the detailed description of an embodiment thereof, given by way of non-limiting example with reference to the accompanying drawings.

DETAILED DESCRIPTION OF A PREFERRED EMBODIMENT OF THE INVENTION

Figure 2:
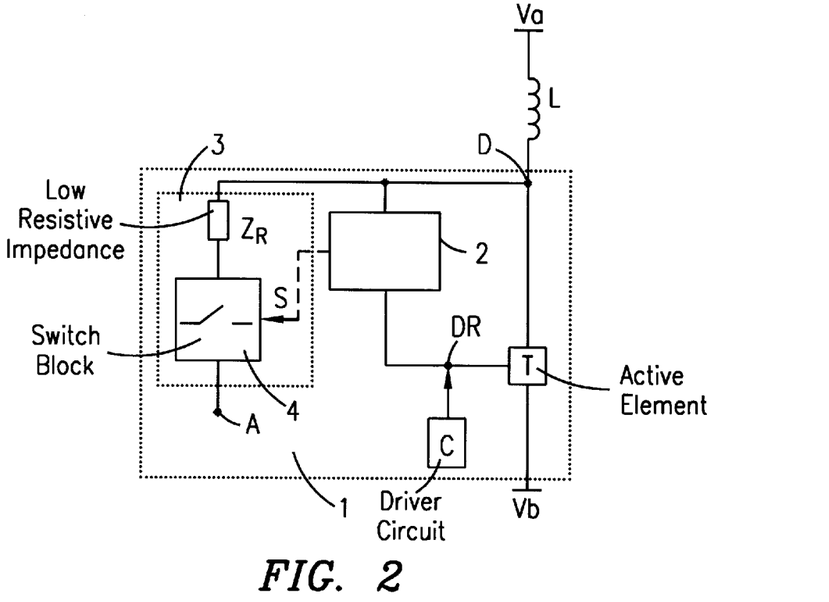
FIG. 2 is a functional block diagram of a recycling circuit allowing damping of the oscillation according to the present invention.

FIG. 2 shows a block diagram of a device which comprises a circuit for the controlled recycle and without final oscillation, of the discharge current from an inductive load, according to the present invention.

An inductive load L is connected between first and second power supply terminals which are held at constant voltages Va and Vb. The terminals Va and Vb typically represent a power supply line and ground. The present invention encompasses both the low-side configuration, wherein Va would correspond to the supply voltage, and the high-side configuration, wherein the supply line would be identified by Vb. Connected to the inductive load L, of which one end is connected to the supply terminal Va, is a control circuit which includes a circuit for the recycle with no final oscillation embodying the present invention. The circuit, generally denoted by 1, is preferably an integrated circuit and has a terminal, represented by node D, for connection to the inductive load.

Circuit 1 comprises an active element T connected, in series with the inductive load L, between the two supply terminals Va, Vb. As shown in FIG. 2, the active element T is specifically connected to the node D and the supply terminal Vb. The active element T typically consists of a power switch, such as a bipolar or a MOS transistor, having a control terminal DR. A driver circuit, represented by block C, is linked functionally to the terminal DR to alternately drive the active element T on and off, as required for a particular application. A recycling regulating means 2, for regulating the recycling of the discharge current from the inductive load L, is connected to the node D and the control terminal DR of the active element T. For the purpose of the present invention, the means 2 may be any conventional circuit of the kind for instance of those previously described in connection with the prior art.

The inductive load L is driven directly through the active element T acting as a switch to regulate the flow of current through the load. The driver circuit C acts to turn on the active element T which, when turned on, will force the current to flow through L. Upon the driver circuit C cutting off the current flow through the inductive load L, such that it becomes necessary to re-direct a recycling current through the active element T, as previously described, the regulating means 2 re-enables the active element upon a voltage threshold $V_{max}$ being reached at the node D.

In accordance with the present invention, the circuit 1 further includes a circuit for controlling the voltage oscillation at the connection node D, at the end of the recycling. This circuit is shown diagramatically within an area bound by a dash line and denoted by 3. The circuit 3 substantially comprises a circuit means with a relatively low resistive impedance, indicated by a block $Z_R$, and having a terminal connected to the connection node D between the active element T and the inductive load L. In its simplest form, the block $Z_R$ would consist of one or more resistors. The resistive impedance of $Z_R$ may be seen from the node D at certain operational stages only, and particularly for the purpose of this invention, it must be seen at least at the end of the recycling, when the active element starts to power down.

To this aim, as shown in FIG. 2, it is preferred that a switch block 4 be connected between the block $Z_R$ an a node A having substantially zero impedance toward at least one of the first and second supply terminals Va and Vb, that is coupled electrically to at least one of Va and Vb. The switch block 4 functions as a controlled witch sensitive to or responsive to a control signal, indicated in FIG. 2 by an arrow S, determining its state. Depending on the signal S, the switch block 4 will allow selective connection of the block $Z_R$ to the node A.

Thus, the block $Z_R$ is coupled to the node A. In essence, the node A itself may be either Va or Vb, or a terminal of a generator means not isolated electrically from Va or Vb, i.e. one terminal of another generator having the other terminal connected to Va or Vb. The important thing is that a path be assured for a current flow through $Z_R$ from the inductive load L, which has one end connected to the supply terminal Va, at least at the end of the recycling, in order to prevent the establishment of oscillation. In other words, enabling this connection of the block $Z_R$ at a given operation phase is the same as connecting a resistive type of impedance to the connection node D in parallel with the resistive already present on that node at the specific operation phase.

The control signal S for the present invention should be active when, at the end of the recycling, the active element starts to power down, i.e. when the recycling current through the active element becomes zero and the voltage at the node D drops to a low value, that is at time t1 in FIG. 1. The relatively low impedance applied to the node D must be seen at the time t1, when an oscillation would possibly commence. Due to the parallel circuit arrangement, the overall resistance value R" at the node D, upon the block $Z_R$ being connected in, is lower than the resistive impedance value of the block $Z_R$. Accordingly, with a suitable resistive impedance value of $Z_R$, R" lies appreciably below the overall resistance R' of when the block $Z_R$ is disconnected. The factor of merit Q" of the equivalent LRC circuit at the end of the recycling is, therefore, significantly lower than that, Q', of a conventional circuit, and with a suitable resistive impedance value of the block $Z_R$, the oscillation can be suppressed. It should be noted that the switch block 4 could also connect the block $Z_R$ to the node A at different stages of the circuit operation, if required.

To evaluate the magnitude of the resistive impedance of the block $Z_R$, account should be taken as already mentioned of that the connection between the block $Z_R$ and the node A is to be enabled at the end of the recycling, in this invention. At this stage, the actual resistance seen from the node D is substantially determined by the usually very high resistance of the active element T during the power down phase. Therefore, to evaluate effective resistive impedance values of the block $Z_R$ for the purpose of the invention, it is basically the resistance of the active element at power-down that should be taken for reference. Accordingly, the resistive impedance value should be selected to meet these requirements.

The control signal S may be expediently generated directly by the recycling regulating means, as shown schematically in the figure by the dash line joining S with the circuit means 2. In the preferred embodiment, the control signal further includes a signal indicating the end of the recycling, so that the switch block is enabled at the moment the active element is turned off. In this way, the relatively low resistive impedance of $Z_R$ will be seen at the exact time t1, which has the advantage of disabling the block $Z_R$ during the recycling to avoid malfunctioning due to incorrect discharge of the current from the inductive load through the active element. Circuit 3 can be disconnected via switch block 4 so as to not impair the normal operation of the device where the presence of too low a resistance at the load connection node may cause current losses, e.g. with the active element in the off condition and once the recycling phases are completed.

Figure 3:
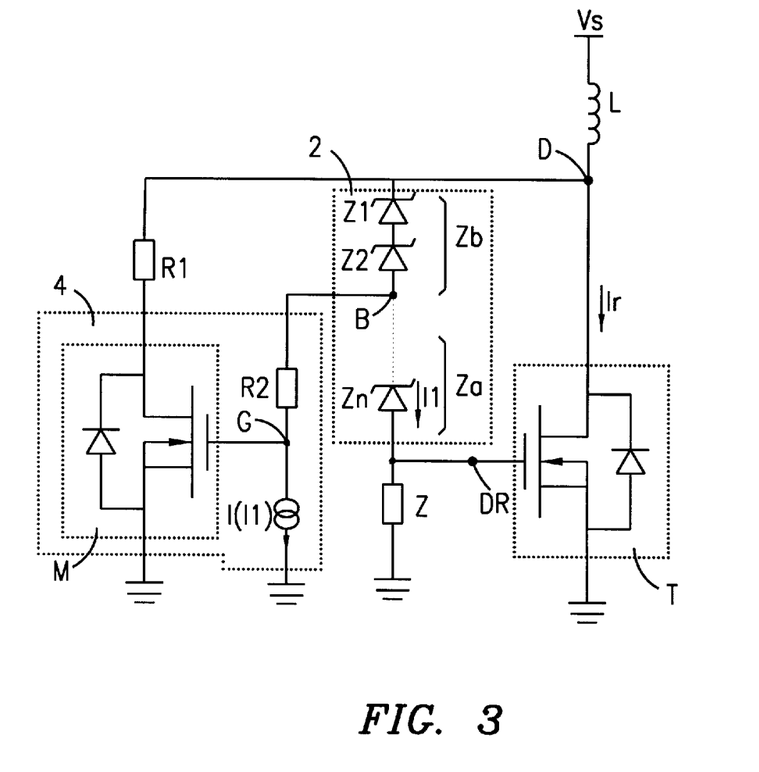
FIG. 3 is a circuit diagram of a preferred embodiment of a circuit according to the invention intended for a low-side driver type of application.

A preferred embodiment of the recycling circuit according to the invention is shown in greater detail in FIG. 3. In this figure, similar blocks and elements are denoted by the same references as in FIG. 2. FIG. 3 illustrates, by way of example, a low-side driver configuration which, as previously mentioned, is typically employed in application relating to fuel injectors. One terminal of the load L is connected to a power supply line Vs, such as a battery, and the other terminal is connected to the connection node D.

The active element T for driving the load comprises a MOS transistor of the N-channel type. In some applications where the inductive load drive current is fairly large, this transistor is preferably a power transistor. The transistor T has a drain terminal connected to the node D and a source terminal connected to ground. A gate terminal provides the control terminal DR. The circuit means with relatively high impedance of the invention is represented by a resistor R1. Alternatively, it could be represented by a number of interconnected resistors.

The switch block 4 comprises a switching element, such as a MOS transistor M of the N-channel type, a controlled current generator I and resistor R2. The transistor M is connected in series with the resistor R1 between the connection node D and ground which, in this case, forms the node A shown in FIG. 2. Connected to a drive terminal G, specifically a gate terminal, of the transistor M are a first end of the resistor R2 and the current generator I, the latter being also connected to ground, i.e. to the node A. In this preferred arrangement, the recycling regulating means 2 comprises a chain of n recycling zener diodes, denoted by Zi, where i=1,. . . , n. The zener chain is connected, as previously described in relation to the prior art, between the connection node D and the control terminal DR, and so configured as to limit the voltage value at the node D to within the threshold value Vmax during recycling.

Figure 4:
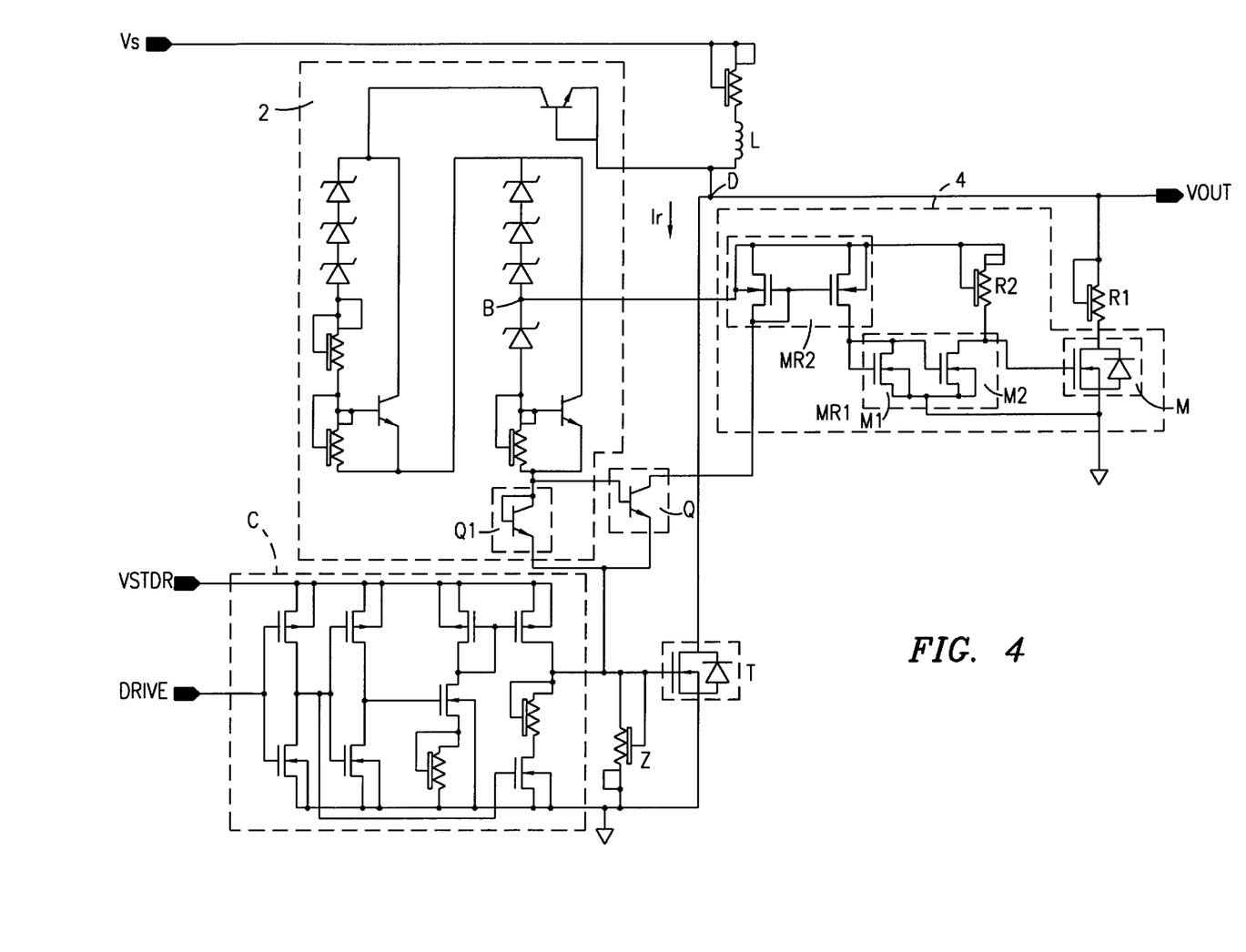
FIG. 4 shows an embodiment of the circuit shown in FIG. 3.

An intermediate point B in the chain of zener diodes divides the chain into a first lower portion Za and a second upper portion Zb. The portion Za consists of a number m of zener diodes and has the end not connected to the point B coupled to the gate terminal DR of the transistor T. The portion Za is shown in the figure connected directly to DR, but coupling elements would usually be interposed as explained herein below in relation to an example of a related embodiment as illustrated in FIG. 4. The upper portion Zb of the zener diode chain comprises the remaining n–m zener diodes in the chain and has instead one end connected to the connection node D.

The point B, being located intermediate a zener pair, is a node with a high capacitive impedance due to parasitic capacitances inherent to the integrated circuit configuration. A second terminal of the resistor R2 is connected to the point B. The current generator I is controlled by a current I1 which, as explained herein below, is caused to circulate within the circuit means 2 during recycling. In particular, it is configured to be active in generating the current I only with a non-zero current I1.

In practice, the circuit of FIG. 3 operates as follows. Upon the transistor T being turned off by the driver circuit C, omitted from the figure for simplicity, the voltage at the connection node D rises to a value Vmax preset by the zeners Zi. With voltage $V_{max}$ at node D, the recycling current Ir will flow through transistor T. During recycling, and as shown in the figure, a current is flowed through the chain of zener diodes. Specifically, a current I1 is flowed through the first portion Za of the zener chain. At this stage, since the current I1 is non-zero, the generator I will be in the on state which, in turn, connects the node G, that is the gate terminal of the transistor M, to ground. Accordingly, the transistor M will remain in the off state, and the switch block 4 acts generally as an open switch to disconnect the resistor R1 from ground.

At the end of the recycling, as the transistor T starts to power down, the current I1 becomes zero because of the voltage drop at the connection node D. At that time, the generator I also is in the off state. The gate terminal G of the transistor M is, therefore, connected to the node B through the resistor R2. Then ode B retains for some time the voltage that had been present during recycling because, due to the capacitance being high, the discharge time constant is high, in particular compared to the period of oscillation. Thus, the transistor M is turned on, connecting the resistor R1 to ground precisely at the end of the recycling, which allows the oscillation of the output voltage to be suppressed. Since the current I1 is non-zero during the recycling phase, the switch block is advantageously disabled during that phase.

In essence, the node B functions as a supply node for the switch block 4, at least within the time interval significant for the present invention. The choice of the location of the point B within the zener chain will depend on the voltage required to enable the switch block 4, as well as the circuit design and dimensions. Thus, the adoption of the recycling regulating means comprised of a chain of zener diodes is of special advantage. However, the node B could generally be some other high capacitive impedance node in the circuit which can be held at a substantially constant voltage throughout the entire period of recycling, charging its capacitance.

In general, an advantageous solution is, therefore, that of having the switch block 4 sensitive to the value of the current being recycled through the recycling regulating means 2, and at the same time connected to a node with a high capacitive impedance. In this case, the connection of the resistor R1 is enabled while the recycling currents, Ir and I1, are zero, but the voltage at that node is held constant by virtue of the high capacitive impedance of the node, that is, beneficially only at the end of the recycling. A suitable value for the resistor R1 may be for example in the tens of kilohms, where the active element is a MOS transistor as shown in the figure. It should be noted that the resistance values, if too low, may be a cause for an excessively large power dissipation because the current being flowed would then be a large one.

For the circuit to operate properly, it should be further noted that the control terminal DR of the transistor T is also connected to ground, that is to the supply terminal which is lowest in voltage, through an impedor Z, as shown in FIG. 3. The impedor Z may represent one or more resistive loads, for example. However, where the rate of transfer of the power-on signal, i.e. the discharge time of the terminal DR, is no critical factor, Z may include capacitive loads.

A circuit diagram is shown in FIG. 4, by way of example only, which is related to the embodiment of FIG. 3. In that figure, the blocks shown in the previous figure are denoted by the same numbers and references, for clarity of illustration. The recycling regulating means 2 comprises a bipolar transistor Q1 connected between the zener chain and the control terminal of the transistor T, which forms the aforementioned coupling element.

In the present invention, the current generator I comprises essentially a current mirror circuit consisting of a transistor pair, M1 and M2. The current mirror MR1, powered from the ground node, has a first input connected to the resistor R2 and a second input coupled to a transistor Q through an additional current mirror MR2. The transistor Q serves as a sensor for the current flowing through the lower portion of the zener chain, namely for the current I1. The switch block 4 operates as follows during recycling. Since Q1 is on due to the current I1 being passed, Q also is on, admitting a current through the mirrors MR2 and MR1. Therefore, the transistor M will be off. Upon completion of the recycling phase, no current will be flowing through Q1, and Q will be turned off, thereby cutting off the flow of current through the mirrors MR2 and MR1. Accordingly, the terminal G will be connected to then ode B via R2, and M will be turned on.

FIG. 4 also shows an embodiment of the driver circuit C.

Figure 5:
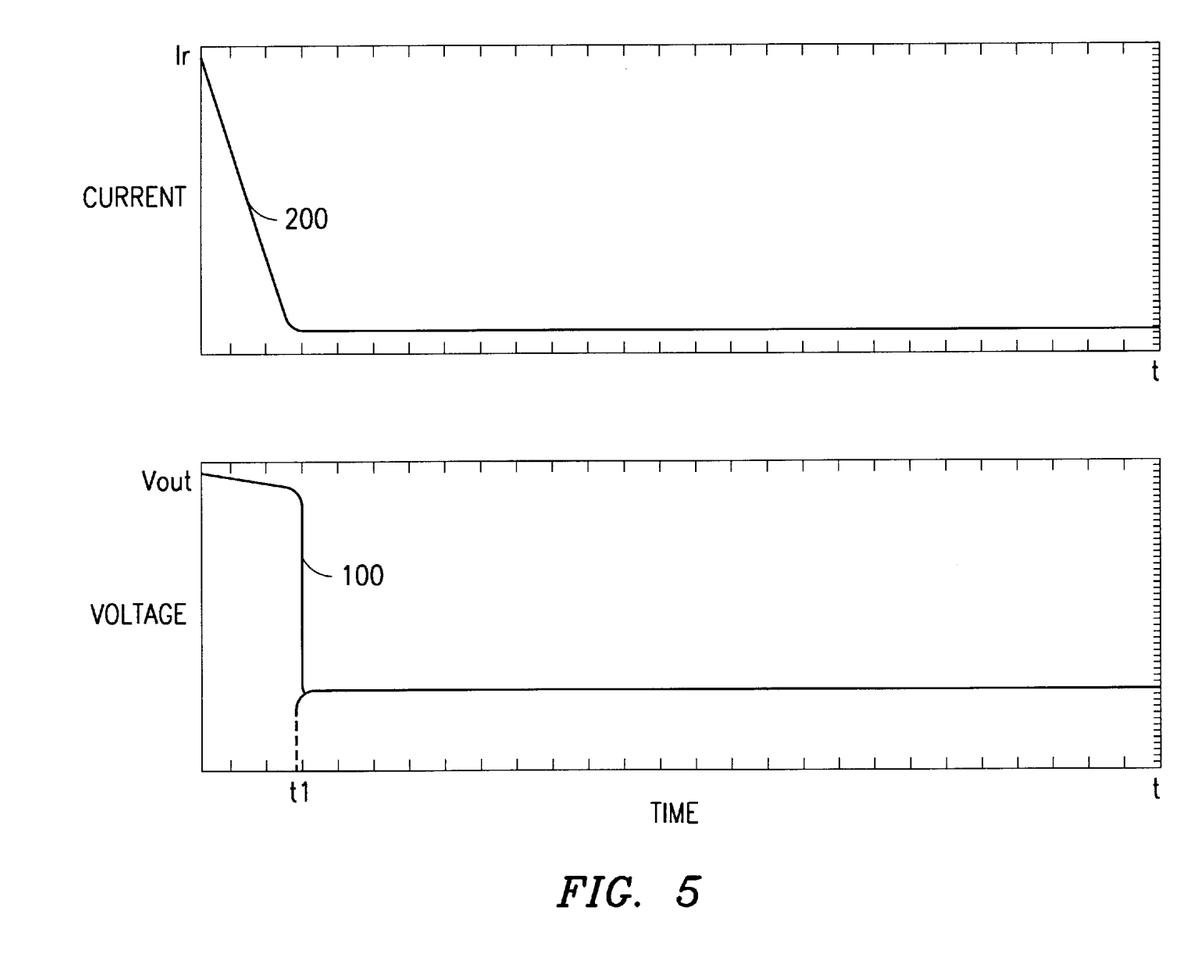
FIG. 5 is a plot of some electric quantities during the recycling phase and the directly following phase, according to the invention.

A simulated pattern of the electric quantities vs. time, during recycling and the phase directly following it, is shown in FIG. 5 for a circuit like that shown in FIG. 4. A curve 100 represents the output voltage Vout, i.e. the voltage at the connection node D to the inductive load L. It can be seen that, at the end of the recycling, the voltage at the time t1 drops slightly below the stationary value, to then attain a stable value without undergoing oscillation. No further problems are to be encountered with the recycling circuit of the invention from the addition of a small resistance value at one end of the load. Indeed as shown in the figure, the current through the load, whose curve is denoted by 200, decreases monotonically to zero.

The circuit of this invention is also uniquely simple, involving no large number of additional circuit elements. It can be adaptable to conventional recycling circuits. It should be noted that the switch block structure in this invention could be realized with different elements than that described. Its one essential requisite is that it should represent a closed switch for the relatively low resistive impedance means at least at the end of the recycling. Furthermore, this circuit means may comprise other circuit elements with equivalent low resistive impedance. For example, the resistor R1 could be replaced with a transistor adapted to be turned on at least during the final phase of the recycling, thereby providing a lower impedance than that of the active element being powered down. Of course, the recycling regulating means may be implemented by some circuit constructions other than that comprised of zener diodes. The active element exemplarly illustrated by a MOS transistor may be replaced with some other active element functioning as a drive switch, such a bipolar transistor or a Darlington.

The present invention also provides a method for the controlled recycle without oscillation of the discharge current from an inductive load L through an active element connected in series with the inductive load between first and second power supply terminals, Va and Vb, and having a control terminal DR to which a driver circuit C is connected to control it to the off and on states. Upon the active element being turned off, a step is provided of generating, depending on attainment of a voltage threshold Vmax at a connection node D between the active element T and the inductive load L, a power-on signal for application to the control terminal DR of the active element T, to start up recycling of the discharge current through the active element.

According to the invention, the method further comprises the steps of:

providing a circuit means $Z_R$ with relatively low resistive impedance;

selectively connecting said circuit means $Z_R$ with relatively low resistive impedance between said connection node D and a node A having substantially zero impedance toward at least one of said first and second power supply terminals Va and Vb, at least upon the active element being turned off at the end of the recycling.

Preferably, the connection of the circuit means ZR with relatively low resistive impedance is enabled by a signal indicating end of the recycling as generated by the recycling regulating means 2.

In this case, the method would further comprise the additional steps of:

powering the switch block 4 for connecting said circuit means ZR with relatively low resistive impedance from a high capacitive impedance node included in said recycling regulating means;

sensing a current I1 caused to recycle through the recycling regulating means 2; and generating the signal indicating end of the recycling when the value of said current I1 is substantially zero.

The principle of this invention would also apply, of course, to different types of devices, e.g., used in industrial systems incorporating a number of stepper motors.

It should be understood that many changes and modifications may be made unto the foregoing recycling circuit without departing from the invention scope as defined in the following claims.

What is claimed is:

1. A circuit for controlled recycling without oscillation of a discharge current from an inductive load, the circuit being of the type which comprises:

an active element connected, in series with the inductive load, between first and second power supply terminals, and having a control terminal to which a driver circuit is connected;

a recycling regulating means connected to a connection node between the active element and the inductive load, and sensitive to an output voltage threshold at said connection node to generate, depending on attainment of said threshold, a power-on signal for application to said control terminal effective to start up and maintain the recycling of the discharge current through the active element until said discharge current reaches zero through the active element and indicates the end of the recycling; and a voltage oscillation control circuit means for controlling the voltage oscillation at said connection node at the end of the recycling, comprising a relatively low resistive impedance element and an input node for supplying an electric potential which is identical to one of said first and second power supply terminals, said control circuit means selectively connecting said relatively low resistive impedance between said connection node and said input node, wherein said selectively connecting of said relatively low resistive impedance occurs at the end of the recycling and suppresses voltage oscillations at said connection node.

2. The circuit according to claim 1, wherein the voltage oscillation control circuit means, further comprises a switch block connected between said relatively low resistive impedance element and said input node, said switch block being sensitive to a control signal active at least at the end of the recycling to selectively enable the connection between said relatively low resistive impedance element and said input node.

3. The circuit according to claim 2, wherein said control signal is derived from said recycling regulating means.

4. The circuit according to claim 3, wherein said control signal includes a signal indicating the end of the recycling.

5. The circuit according to claim 4, wherein said switch block is connected to a high capacitive impedance node held at a substantially constant voltage during recycling, and is sensitive to the value of a recycled current being recycled through said recycling regulating means, thereby enabling the connection between said circuit means and said node when said recycled current is substantially zero.

6. The circuit according to claim 5, wherein said high capacitive impedance node is provided within said recycling regulating means.

7. The circuit according to claim 6, wherein said high capacitive impedance node is an intermediate point in a chain of recycling zener diodes.

8. The circuit according to claim 2, wherein said switch block comprises a switch element connected, in series with said circuit means between said connection node and said node and having a drive terminal to which a first terminal of a resistor and a current generator controlled by said control signal are connected.

9. The circuit according to claim 8, wherein said resistor has a second terminal connected to an intermediate point in a chain of recycling zener diodes which divides the chain into a first portion having one end coupled to said control terminal of the active element an a second portion having one end connected to said connection node, and wherein said current generator is controlled by the current flowing through said first portion of said chain of zener diodes during recycling.

10. The circuit according to claim 9, wherein said current generator comprises at least one current mirror circuit having an input coupled to a passing current sensor sensing the current that flows through said first portion of said chain of zener diodes.

11. The circuit according to claim 9, wherein said switch element is a MOS transistor.

12. The circuit according to claim 1, wherein said circuit means consists of at least one resistor.

13. A method for the controlled recycling without oscillation of a discharge current from an inductive load through an active element connected in series with the inductive load between first and second power supply terminals, said active element having a control terminal to which a driver circuit is connected for driving said active element to the off and on states, wherein, upon the active element being turned off, a step is provided of:

generating, depending on attainment of a voltage threshold at a connection node between the active element and the inductive load, a power-on signal for application to the control terminal of the active element to start-up and maintain recycling of the discharge current through the active element until said discharge current reaches zero through the active element and indicates the end of the recycling; and further comprising the steps of:

providing a circuit means having relatively low resistive impedance; and selectively connecting said circuit means between said connection node and an input node upon the active element being turned off at the end of the recycling, said input node supplying an electric potential which is identical to one of said first and second power supply terminals.

14. The method according to claim 13, wherein the connection of said circuit means is enabled by a signal indicating end of the recycling and generated by a recycling regulating means which also generates said power-on signal to start up the recycling.

15. The method according to claim 14, further comprising the steps of:

powering a switch block for connecting said circuit means from a high capacitive impedance node included in said recycling regulating means;

sensing a current caused to recycle through said recycling regulating means; and generating the signal indicating end of the recycling when the value of said current is substantially zero.

* * * * *